(12) United States Patent
Nguyen

(10) Patent No.: US 6,528,124 B1
(45) Date of Patent: Mar. 4, 2003

(54) DISK CARRIER

(75) Inventor: Tin Nguyen, San Jose, CA (US)

(73) Assignee: Komag, Inc., San Jose, CA (US)

( * ) Notice: Subject to any disclaimer, the term of this patent is extended or adjusted under 35 U.S.C. 154(b) by 0 days.

(21) Appl. No.: 09/811,120

(22) Filed: Mar. 17, 2001

Related U.S. Application Data

(60) Provisional application No. 60/251,097, filed on Dec. 1, 2000, and provisional application No. 60/264,235, filed on Jan. 24, 2001.

(51) Int. Cl.[7] .............................. B05D 1/00; C23C 14/34; B05C 13/00; B23Q 1/25; B25B 1/20
(52) U.S. Cl. .............. 427/445; 204/298.15; 204/192.1; 118/500; 269/15; 269/37; 269/47; 269/50; 269/55
(58) Field of Search ................... 204/192.1, 298.15, 204/298.23; 427/445; 118/500; 269/15, 37, 47, 50, 55

(56) References Cited

U.S. PATENT DOCUMENTS

| | | | | | |
|---|---|---|---|---|---|
| 4,595,481 | A | * | 6/1986 | Allen et al. | 204/298 |
| 4,650,064 | A | * | 3/1987 | Slabaugh | 198/631 |
| 5,244,555 | A | * | 9/1993 | Allen et al. | 204/192.2 |
| 5,296,118 | A | * | 3/1994 | Allen et al. | 204/192.12 |

* cited by examiner

Primary Examiner—Steven H. VerSteeg

(57) ABSTRACT

A first disk carrier constructed in accordance with the invention is substantially circular, and has a size and shape such that it can be placed in an opening in a second, larger disk carrier. In one embodiment, the second, large disk carrier is a conventional disk carrier, e.g. used to hold a substrate during a magnetic disk manufacturing process. The first disk carrier is circular, and has a diameter equal (or substantially equal) to common substrates currently being manufactured. Therefore, the first disk carrier fits in and can be held by the second disk carrier. The first disk carrier has one or more openings for holding one or more substrates that have a diameter substantially less than the diameter of the opening of the second disk carrier.

57 Claims, 5 Drawing Sheets

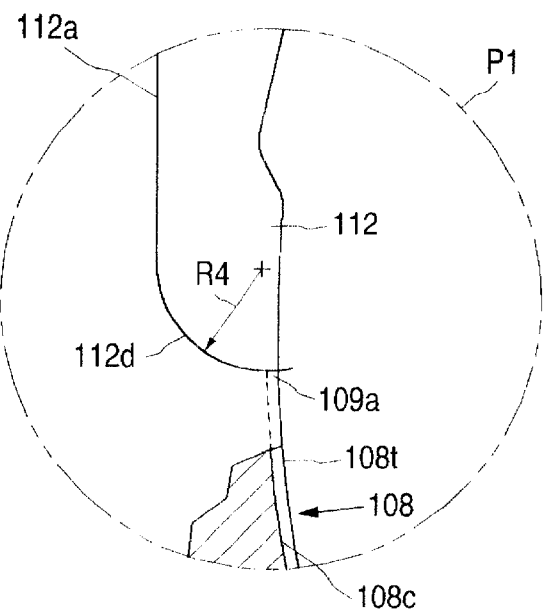
FIG. 1C
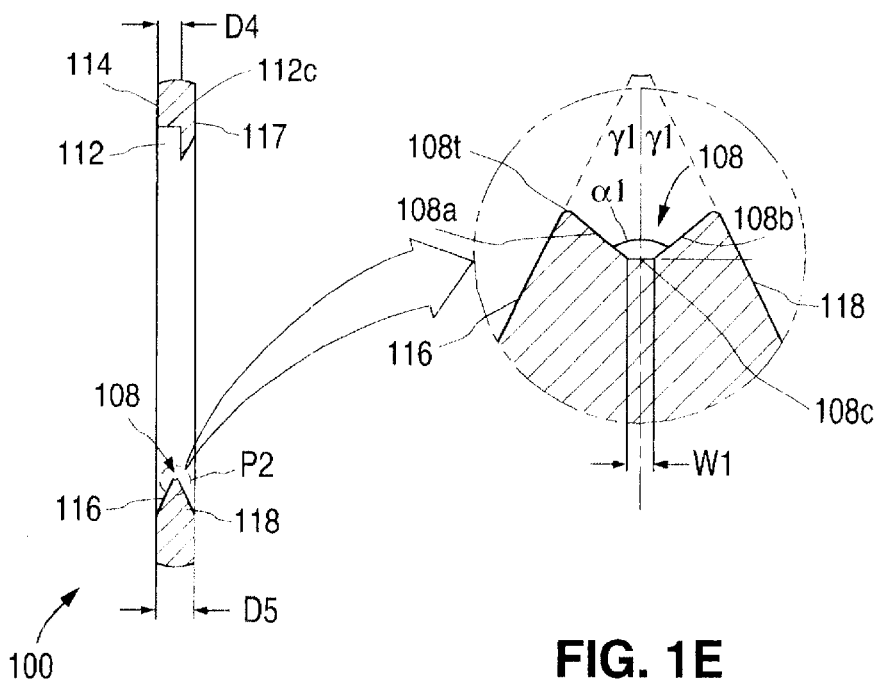
FIG. 1D
FIG. 1E

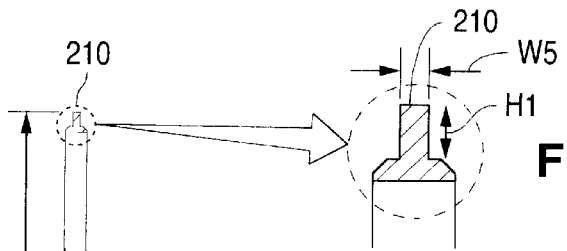
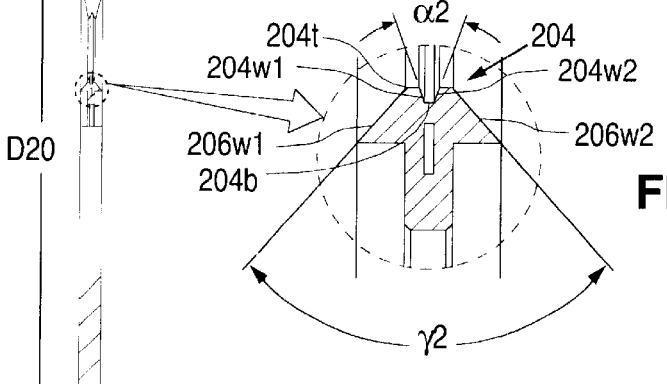
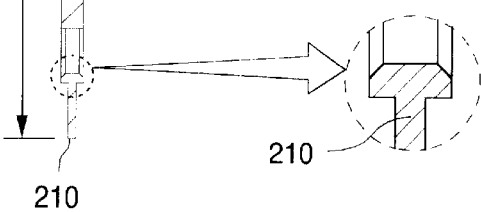
FIG. 2C  FIG. 2D-1  FIG. 2D-2  FIG. 2D-3
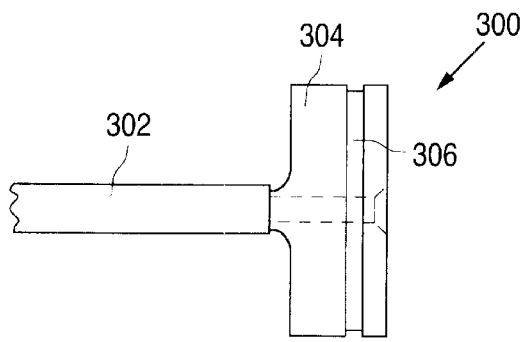
FIG. 3A
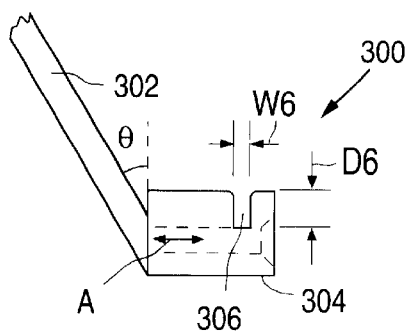
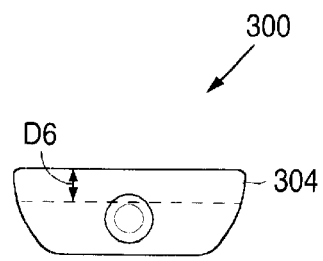
FIG. 3B  FIG. 3C

DISK CARRIER

This application claims priority based on provisional patent application Ser. No. 60/251,097, filed Dec. 1, 2000 and Ser. No. 60/264,235, filed Jan. 24, 2001. These applications are incorporated herein by reference.

BACKGROUND OF THE INVENTION

This invention pertains to structures for holding disks during sputtering. This invention also pertains to methods and apparatuses for manufacturing magnetic disks.

Magnetic disks are typically manufactured by sputtering an underlayer, a magnetic alloy film and a protective overcoat, in that order, on a disk-shaped substrate. An example of such a process is described in U.S. patent application Ser. No. 08/984,753, filed by Bertero et al. on Dec. 4, 1997 (now U.S. Pat. No. 6,150,015, issued Nov. 21, 2000), incorporated herein by reference.

During sputtering, the following steps are typically performed:
1. A disk-shaped substrate is placed in a "disk carrier". (The substrate can be glass, glass ceramic, aluminum plated with a nickel-phosphorus alloy, or other appropriate material. The nickel-phosphorus alloy is sometimes referred to as "NiP".)
2. In some (but not all) manufacturing processes, the disk carrier carries the substrate past a heating element for heating the substrate.
3. The disk carrier carries the substrate through sputtering apparatus, past several sets of sputtering targets.
4. The substrates are then removed from the disk carrier.

Various types of disk carriers are known in the art. For examples of disk carriers used during low temperature sputtering processes see U.S. Pat. Nos. 5,244,555; 5,296,118; and 4,595,481, each assigned to Komag, Inc. and incorporated herein by reference. These disk carriers include a vertical plate with a substantially circular opening for receiving a disk-shaped substrate. A groove is provided in the bottom of the circular opening for receiving and holding the outer edge of the substrate. During low temperature sputtering processes, the substrate is placed within the carrier and carried past a set of sputtering targets. The substrate is typically not carried past a heating element prior to sputtering. Therefore, the carrier need not accommodate much thermal expansion of the substrate relative to the carrier.

U.S. patent application Ser. No. 09/428,301, filed Oct. 27, 1999 abandoned and assigned to Komag, Inc., teaches and claims several types of disk carriers used in a high temperature sputtering process. (The '301 application, which is now abandoned, is incorporated herein by reference.) The '301 carriers also include a vertical plate with a circular opening for receiving a substrate. For example, in '301 FIGS. 2A to 2E (FIGS. 1A to 1E of the present application), the '301 application shows an embodiment of a disk carrier 100 comprising a vertical plate 102 having a substantially circular opening 104 for receiving a disk-shaped substrate 106. During a high temperature sputtering process, carrier 100 carries substrate 106 past a heating element prior to sputtering. Because substrate 106 has a much lower thermal mass than carrier 100, the temperature of substrate 106 can exceed the temperature of carrier 100 by 200° C. or more. Accordingly, carrier 100 has the following characteristics.
1. Opening 104 has a size and shape such that it can hold substrate 106 when substrate 106 and carrier 100 are both at room temperature.
2. Opening 104 can hold substrate 106 when substrate 106 is at an elevated temperature with respect to carrier 100 without having carrier 100 pressing against substrate 106 so as to cause substrate 106 to bend or bow.

Substrate 106 is disk-shaped and has a diameter of 95.025 mm (e.g. a radius of about 47.513 mm) at room temperature, a thickness of 0.80 mm at room temperature, a diameter of 95.572 mm at 300° C. and a thickness of 0.890 at 300° C. Substrate 106 has a central aperture 107 formed therein. Substrate 106 typically comprises an aluminum alloy plated with a NiP.

Opening 104 of carrier 100 comprises an upper circular portion 104$u$ and a lower circular portion 104$l$. Upper circular portion 104$u$ has a radius R1 equal to about 48.82 mm about a center C. (Radius R1 is greater than the room temperature substrate radius.)

Lower portion 104$l$ of opening 104 extends about an arc of approximately 176°. Within lower circular portion 104$l$ is a groove 108 (FIGS. 1C to 1E) for receiving an outer edge 106$a$ of substrate 106. Groove 108 extends continuously along the length of circular portion 104$l$. Groove 108 includes side walls 108$a$, 108$b$ (FIG. 1E) which form an angle α1 of about 100° and a floor 108$c$ having a width W1 of about 0.25 mm. The distance D1 (FIG. 1A) between the center C of opening 104 and the top 108$t$ of groove 108 is typically between 47.424 and 47.454 mm (i.e. less than the substrate radius). The distance between the center C of opening 104 and floor 108$c$ of groove 108 is typically between 47.907 and 47.937 mm (i.e. greater than the substrate radius). Groove 108 terminates when it reaches points 109$a$, 109$b$ (FIG. 1A). Points 109$a$, 109$b$ are about 2° below the horizontal diameter of opening 104.

At room temperature substrate 106 has a radius of 47.513 mm and a thickness of 0.800 mm. Thus, when substrate 106 is at room temperature and rests in groove 108, edge 106$a$ of substrate 106 is a distance D2 of about 0.12 mm from floor 108$c$ of groove 108 (FIG. 1E'). At a substrate temperature of 300° C., edge 106$a$ is about 0.16 mm from floor 108$c$. Substrate 106 is adequately supported by groove 108 when substrate 106 is at room temperature (about 20° C.). However, because the radius of floor 108$c$ of groove 108 is greater than the substrate radius at room temperature, carrier 100 can accommodate thermal expansion of substrate 106 without causing substrate 106 to bow outwardly. During some high temperature processes, substrate 106 is heated to a temperature of about 200° C. before sputtering.

Above points 109$a$, 109$b$, groove 108 terminates, and a recess 112 having a depth D4 of about 6.35 mm (FIG. 1D) is formed in a side 114 of carrier 100. (Carrier 100 has a width D5 of about 11 mm.) The walls of recess 112 include first and second portions 112$a$, 112$b$ (FIG. 1A) which extend in a linear direction, and a third, curved portion 112$c$. Recess 112 permits loading and removal of substrate 106 from side 114 of carrier 100. (However, it is not feasible to load substrate 106 from the other side 117 of carrier 100.) Curved portion 112$c$ of the wall of recess 112 is circular, and has a radius R2 of about 53.80 mm from a point C' that is a distance D3 about 4.44 mm above center point C. Linear walls 112$a$ and 112$b$ are a distance D4 of about 52.10 mm from point C'.

A bevel 116 is formed on side 114 of carrier 100 to facilitate exposure of substrate 106 to plasma during sputtering. Similarly, a bevel 118 is formed on side 117 of carrier 100, also to facilitate exposure of plasma to substrate 106 during sputtering. Bevels 116 and 118 form an angle γ1 of 26° (FIG. 1E) with the side of carrier 100. Bevels 116 and 118 are circular, with a radius R3 of about 57.16 mm from center C (FIG. 1A).

FIG. 1C is an expanded view of a portion P1 of FIG. 1A where groove 108 terminates. As can be seen, below wall 112a, a wall 112d that curves downward and to the right toward opening 104 bounds recess 112. The radius of curvature R4 of wall 112 is about 4 mm.

The '301 application teaches and claims several other types of substrate carriers, e.g. as shown in '301 FIGS. 3A to 3C and 4A to 4D. The embodiment of '301 FIGS. 3A to 3C permits a substrate to be loaded and unloaded from either side of the disk carrier. The embodiment of '301 FIGS. 4A to 4D has a groove that is shallower at the lowest point of the opening (e.g. near point 109c) than away from the lowest point of the opening (e.g. near points 109a, 109b). This makes it easier for the carrier to hold the substrate when the substrate is at room temperature without having the substrate fall out of the opening. As mentioned above, the '301 application is incorporated herein by reference.

Magnetic disks come in standard sizes. One of the most prevalent sizes is 95 mm diameter disks. Accordingly, the substrates used to manufacture such disks are about 95 mm (e.g. 95.025 mm) in diameter, and substrate carriers used to manufacture such disks have openings designed to accommodate such substrates.

Recently, smaller disk sizes have been introduced. For example, disks are being designed that are about 27 mm in diameter. Normally, this would require retooling the manufacturing apparatus to accommodate the new substrate sizes. For example, one would have to design and build completely new substrate carriers. Such retooling is expensive and difficult. It would be desirable to be able to accommodate this smaller substrate size with a minimum of effort.

SUMMARY

A first substrate carrier in accordance with the invention holds one or more of substrates (e.g. five substrates) during a deposition process (e.g. a sputtering process). In one embodiment, the substrates have a smaller diameter than substrates now prevalent (e.g. smaller than 95 mm).

In one embodiment, the first substrate carrier fits within an opening in a second substrate carrier. The opening of the second carrier is substantially circular, and has a size and shape such that it can accommodate a substrate such as (for example) a 95 mm diameter substrate. The second substrate carrier can be a carrier in accordance with the '301 application or the above-incorporated Komag patents. The second carrier can also be in accordance with another carrier design. However, during a method in accordance with this invention, instead of simply carrying a substrate, the second carrier carries the first substrate carrier, and the first substrate carrier holds one or more of substrates.

In one embodiment, the second carrier comprises one opening for receiving either a substrate or the first carrier. In another embodiment, the second carrier can have more than one opening for receiving either substrates or carriers.

The first and second substrate carriers can be designed for low temperature sputtering processes. Alternatively, the first and second carriers can be designed for high temperature sputtering processes.

In one embodiment, the first and second carriers can be used in conjunction with a sputtering process. In another embodiment, the first and second carriers can be used in conjunction with other kinds of deposition processes, e.g. chemical vapor deposition, plasma-enhanced chemical vapor deposition, cathodic arc deposition or ion beam deposition.

In one embodiment, the substrates are used during magnetic disk manufacturing. Such substrates can be metallic (e.g. an aluminum alloy plated with NiP), glass, glass ceramic or other material. In other embodiments, the substrates are used during other types of manufacturing processes, e.g. integrated circuit manufacturing.

In one embodiment, the carriers are used in conjunction with in-line sputtering apparatus. Alternatively, the carriers can be used in conjunction with static sputtering apparatus.

In static sputtering apparatus, in the prior art, a substrate carrier holds up to two substrates and material is only sputtered onto one substrate at a time. In the present invention, without modifying the original carrier, the sputtering apparatus can now sputter material from a sputtering target onto several substrates simultaneously, e.g. five substrates at a time. Thus, a carrier in accordance with the present invention has the advantage of permitting one to deposit layers on several substrates simultaneously to thereby increase throughput when using such a carrier. In other words, throughput is increased by permitting deposition on more substrates simultaneously than the sputtering apparatus and carrier previously accommodated.

BRIEF DESCRIPTION OF THE DRAWINGS

FIG. 1A' shows the disk carrier of FIG. 1A carrying a substrate.

FIG. 1C is an expanded view of a portion P1 of the disk carrier of FIG. 1A.

FIG. 1D is a cross section view of the disk carrier of FIG. 1A along lines D—D.

FIG. 1E' illustrates portion P2 when the disk carrier is holding a substrate.

FIG. 2C illustrates in cross section the disk carrier of FIGS. 2A and 2B.

FIGS. 2D-1, 2D-2 and 2D-3 are magnified cross section illustrations of portions of the disk carrier shown in FIGS. 2A to 2C.

FIGS. 3A is a top view of a tool for placing the carrier of FIG. 2 in and removing the carrier of FIG. 2 from the carrier of FIG. 1.

FIG. 3B is a side view of the tool of FIG. 3A.

FIG. 3C is a front view of the tool of FIGS. 3A and 3B.

BRIEF DESCRIPTION OF THE DRAWINGS

FIGS. 2A to 2E illustrate a disk carrier 200 constructed in accordance with the present invention. Disk carrier 200 is substantially circular, and has a diameter D20 of about 95 mm. Carrier 200 comprises five substantially identical circular openings 202-1 to 202-5 for holding disk substrates. (Of course, in other embodiments, carrier 200 can have more or fewer than five openings 202.) In one embodiment, these disk substrates (not shown) are disk shaped, have an outer diameter of about 27.400±0.050 mm, an inner diameter of about 7.012±0.012 mm, and a thickness of about 0.250±0.020 mm, but other size substrates (and thus other size openings) can be used. Carrier 200 is used to hold disk substrates during sputtering. In particular, during use, a substrate is loaded into each of openings 202-1 to 202-5, and carrier 200 carries these substrates past sputtering targets where the various magnetic disk layers are deposited on the substrates to manufacture magnetic disks. (As mentioned above, these layers typically include one or more underlayers, one or more magnetic alloy layers and one or more protective overcoats. Also as mentioned above, one example of such a manufacturing process is discussed in the above-incorporated Bertero application.) Thereafter, the substrates are removed from carrier 200, e.g. by placing the substrates in a cassette.

Figure 1A:
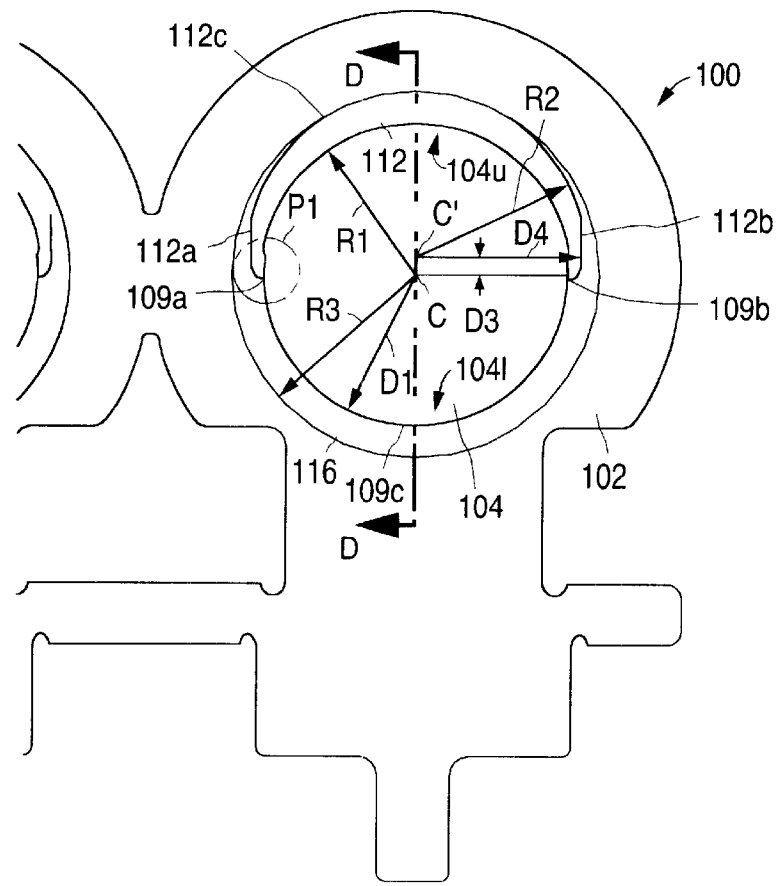
FIG. 1A shows a first side of a disk carrier constructed in accordance with a first embodiment described in copending application Ser. No. 09/428,301 (now abandoned).
Figure 1E:
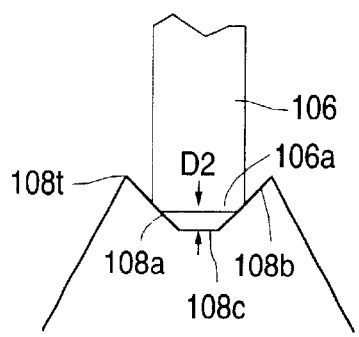
FIG. 1E is an expanded view of a portion P2 of FIG. 1D.
Figure 1A:
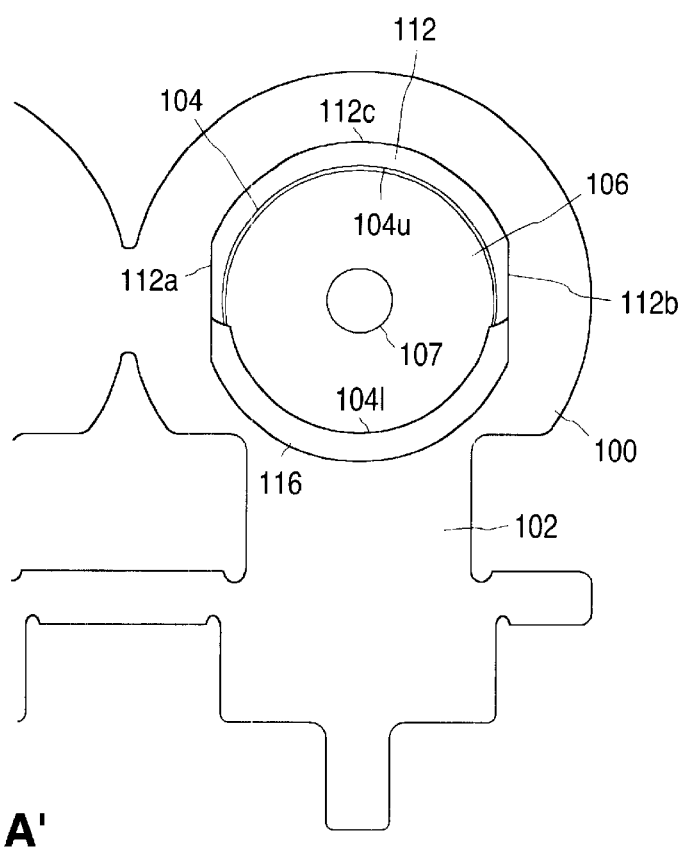
Figure 1B:
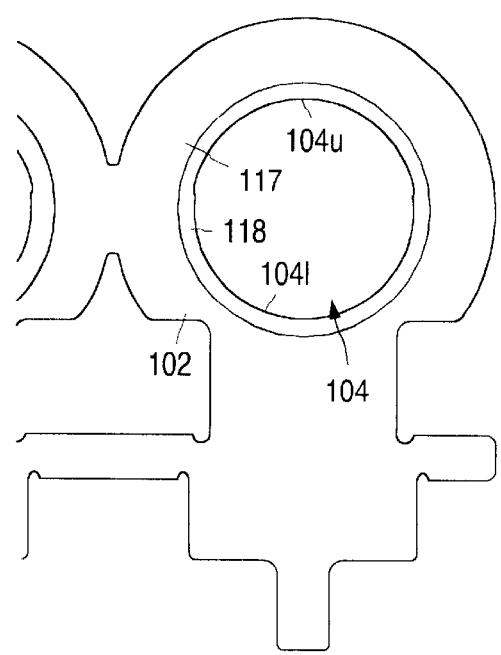
FIG. 1B shows a second side of the disk carrier of FIG. 1A.
Figure 2A:
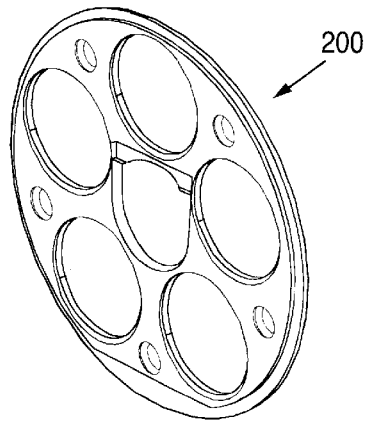
FIG. 2A is a perspective view of a disk carrier constructed in accordance with the present invention.
Figure 2B:
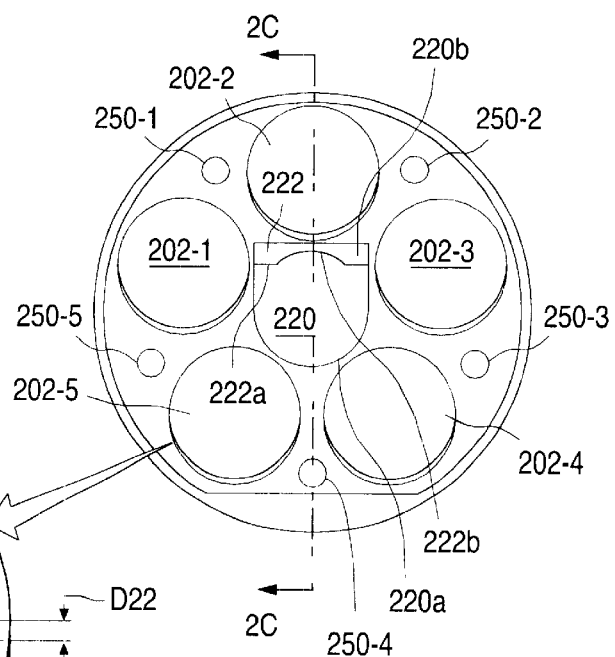
FIG. 2B is a side view of the disk carrier of FIG. 2A.
Figure 2E:
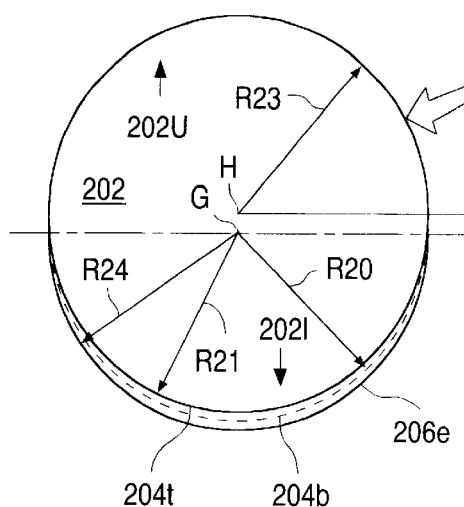
FIG. 2E illustrates a groove in an opening within the disk carrier of FIGS. 2A to 2D.

As shown in FIGS. 2C and 2E, the lower portion 202*l* of each opening 202 comprises a groove 204 for receiving and holding the outer edge of a substrate. Grooves 204 have the characteristic that the bottom 204*b* of groove 204 extends about an arc that has a radius that is greater than the radius of the substrate that is to be loaded therein. In one embodiment, this arc extends about a center point G (FIG. 2E), and has a radius R20 of about 13.722 mm. The top 204*t* of groove 204 extends about an arc centered at point G, and has a radius R21 of 13.222 mm. In contrast the substrates to be loaded into groove 204 have a radius of 13.700±0.025 mm. Because of this, if the substrate expands due to thermal expansion, openings 202 will still be able to hold the substrate, without having the substrate bow or bend. (Again, it is noted that the dimensions set forth herein are merely exemplary, and other dimensions can be used.)

Openings 202 contain an upper circular portion 202*u* (FIG. 2E). Portion 202*u* extends along an arc having a radius R23 of 14.261 mm about a center point H. Center point H is a distance D22 of about 1.42 mm above center point G. Because of the fact that radius R23 is greater than the radius of the substrates, and because center point H of upper portion 202*u* is above center point G of lower portion 202*l*, one can easily load substrates into groove 204 from either side of carrier 200.

Grooves 204 have inner walls 204-w1, 204-w2 that form an angle α2 of about 30°. The outer walls 206-w1, 206-w2 of carrier 200 near grooves 204 form a bevel, and extend at an angle γ2 of about 90° relative to each other. This bevel facilitates exposure of the substrate loaded in carrier 200 to plasma within the sputtering chamber. The outer edge 206*e* of walls 206-w1, 206-w2 extends about an arc having a radius R24 of about 14.30 mm from center point G.

As mentioned above, prior art substrates 106 were about 95 mm in diameter, and were loaded into disk carriers, such as carrier 100 of FIGS. 1A to 1E. Carrier 100 has an opening 104 for holding such substrates. In accordance with the present invention, carrier 200 is loaded into opening 104 of carrier 100. Since carrier 200 has a diameter of 95 mm, it readily fits within opening 104. Thus, one can use currently existing tooling (geared toward manufacturing 95 mm disks) to manufacture smaller disks (e.g. disks that are 27.4 mm in diameter). As seen in FIGS. 2C, 2D-1 and 2D-3, a lip 210 extends from the outer circumference of carrier 200. The width W5 of lip 210 can be 1.20 mm. The height H1 of lip 210 can be 2 mm. In one embodiment, lip 210 can be inserted into groove 108 of carrier 100.

While carrier 100 is typically designed to accommodate thermal expansion of a substrate, carrier 200 does not typically substantially expand relative to carrier 100. In one embodiment, this can be because carrier 100 and 200 are used in a low temperature sputtering process. In another embodiment, this can be because the thermal mass of carrier 100 is such that it does not increase very much in temperature relative to carrier 100 during use. Thus, it is not necessary to use carrier 200 in conjunction with a carrier that accommodates much if any thermal expansion of carrier 200. However, in alternative embodiments, one can provide a carrier 200 that does expand relative to carrier 100 during use. In such an embodiment, carrier 100 is typically designed to accommodate such expansion.

Also shown in FIGS. 2A, 2B and 2C is a central opening 220. This opening has a U-shaped bottom region 220*a* and a flat top 220*b*. A flat metal member 222 extends across the top of central opening 220, and a bottom edge 222*a* of flat member 222 includes an indentation 222*b* for receiving a tool 300 that is used to lift carrier 200 in and out of carrier 100. Tool 300 is shown in FIGS. 3A to 3C, and is designed to place carrier 200 in opening 104 prior to sputtering, and to remove carrier 200 from opening 104 after sputtering.

Referring to FIG. 3, tool 300 includes an arm 302 affixed to an end piece 304. End piece 304 is designed to mate with the structures in opening 220. In particular, End piece 302 has the shape of a generalized cylinder with a notch 306 cut therein. Notch 306 has a width W6 that can be about 1.3 mils wide and a depth D6 about 3.0 mils deep, and is designed to mate with flat member 222 of FIGS. 2A and 2B. The unique shape of opening 220, member 222 and end piece 304 enable one to ensure that carrier 200 is right side up when carrier 200 is grabbed by tool 300. This prevents substrates from falling out of carrier 200 during handling.

Arm 302 is at an angle θ (FIG. 3C) with respect to the axis A of end piece 304 to facilitate placing carrier 200 in and out of a cassette (e.g. before and after sputtering).

Referring back to FIGS. 2A and 2B, carrier 100 contains five relatively small holes 250-1, 250-2, 250-3, 250-4 and 250-5. These holes are primarily for purposes of machining, and will not be discussed in further detail.

As mentioned above, carrier 200 can be placed within and removed from carrier 100. Carrier 200 has a substantially circular exterior so that carrier 200 can fit within a substantially circular opening in another carrier, which other carrier has been designed to carry larger substrates (e.g. 95 mm diameter substrates). In one embodiment, carrier 200 can be used as follows. First, a set of smaller diameter substrates are placed within openings 202 of carrier 200. This can be done either manually or using robotic automation. Thereafter, tool 300 can be used to pick up carrier 200 and place it in a cassette. Since carrier 200 typically has a diameter that is about the same as the diameter of common magnetic disk substrates, a conventional cassette can be used to hold and transport a set of carriers 200. (Cassettes are, of course, well-known in the art. See, for example, U.S. Pat. No. 5,657,617, assigned to Komag, Inc. and incorporated herein by reference.)

Thereafter, carriers 200 can be taken out of the cassette and placed within the opening of a carrier such as carrier 100. This can be accomplished with a tool having the design of tool 300. The asymmetric shape of tool 300 facilitates such maneuvering. In particular, since tool 300 only fits into opening 220 in one way, it is not generally possible to accidentally orient carrier 200 such that it is upside down.

After carrier 200 is placed within carrier 100, the two carriers 100, 200 carry the substrates (optionally) past a heating element, and past various sets of sputtering targets. Thereafter, carrier 200 can be unloaded from carrier 100 and placed in a cassette along with other carriers of like design. Again, this can be accomplished using the same or a different tool having the design of tool 300. The disks can be unloaded from carrier 200 later on, either manually or with robotic automation.

While the invention has been described with respect to specific embodiments, those skilled in the art will appreciate that changes can be made in form and detail without departing from the spirit and scope of the invention. For example, the dimensions and sizes set forth above are merely exemplary, and other size structures can be used. Also, a substrate carrier can be used during different types of deposition processes, e.g. CVD, PECVD, ion beam deposition, cathodic arc deposition, and other deposition processes. The openings within carrier 200 (and the substrates carried therein) need not be substantially circular. (For example, the openings within carrier 200 and the substrates therein can be rectangular.) Further, the opening within carrier 100 (and the exterior of carrier 200) need not be circular. (The opening within carrier 100 and the exterior of carrier 200 can be rectangular.) The disk carrier can be made of any appropriate solid material. The substrates can have either chamfered edges or unchamfered edges. (See PCT patent application PCT/US00/21301, incorporated herein by reference.)

One can use means other than tool 300 to move carrier 200 in and out of carrier 100 or in and out of a cassette.

Substrates can be loaded into carrier 100 before carrier 100 is loaded into carrier 200. Alternatively, substrates can be loaded into carrier 100 after carrier 100 is loaded into carrier 200.

Substrates can be removed from carrier 100 after carrier 100 is removed from carrier 200. Alternatively, substrates can be removed from carrier 100 before carrier 100 is removed from carrier 200. In yet another embodiment, carrier 200 need not be removed from carrier 100.

In an embodiment in which carriers 100 and 200 are used for sputtering, the various layers can be sputtered on only one side of the substrate. Alternatively, the various layers can be sputtered on both sides of the substrate. (In such an embodiment, the carrier typically carries the substrates between several pairs of sputtering targets, each pair of sputtering targets being used to deposit material onto the substrate.) As mentioned above, prior to deposition, the carriers can optionally carry the substrates past one or more heating elements. (Two heating elements can be provided, one on either side of the substrates.) Accordingly, all such changes come within the invention.

I claim:

1. A method comprising:
   loading one or more substrates into a first substrate carrier, said first substrate carrier comprising one or more openings, each of said one or more openings accommodating one of said substrates, said first substrate carrier having an exterior such that said first carrier can be loaded into an opening in a second substrate carrier.

2. Method of claim 1 further comprising loading said first substrate carrier into said opening of said second substrate carrier.

3. Method of claim 2 further comprising depositing material on said one or more substrates after said loading of said one or more substrates into said first substrate carrier and said loading of said first substrate carrier into said opening of said second substrate carrier.

4. Method of claim 2 wherein said loading of said one or more substrates into said first substrate carrier is accomplished prior to said loading of said first substrate carrier into said opening of said second substrate carrier.

5. Method of claim 2 wherein said loading of said first substrate carrier into said opening of said second substrate carrier is accomplished prior to said loading of said one or more substrates into said first substrate carrier.

6. Method of claim 1 wherein said one or more substrates are substantially disk-shaped and said first substrate carrier has a substantially circular exterior for mating with said opening in said second substrate carrier.

7. Method of claim 6 further comprising loading of said first substrate carrier into said opening of said second substrate carrier, said opening of said second substrate carrier being substantially circular.

8. Method of claim 1 wherein said opening of said second substrate carrier accommodates a substantially disk-shaped substrate.

9. Method of claim 1 further comprising:
   loading said first substrate carrier into said opening in said second substrate carrier; and
   depositing material onto said one or more substrates while said one or more substrates are being held by said first substrate carrier and said first substrate carrier is being held by said second substrate carrier.

10. Method of claim 9 further comprising removing said one or more substrates from said first substrate carrier after said depositing.

11. Method of claim 9 further comprising unloading said first substrate carrier from said opening in said second substrate carrier after said depositing.

12. Method of claim 11 further comprising loading said first substrate carrier into a cassette after said depositing.

13. Method of claim 1 wherein said first substrate carrier comprises a plurality of openings for holding substrates, said method further comprising loading a plurality of substrates into said first substrate carrier.

14. Method comprising unloading a first holder from a cassette, said first holder having one or more openings for receiving a substrate, said first holder having an exterior for being received by a second holder.

15. A method comprising:
   providing a first holder having one or more openings, each opening for holding a substrate, said first holder for permitting deposition of material on a first number of substrates; and
   providing a second holder in at least one of said one or more openings in said first holder, said second holder comprising a plurality of openings for holding substrates, wherein said second holder permits an increase in throughput during deposition.

16. Deposition apparatus comprising:
   a first holder having one or more openings, each opening for holding a substrate, said apparatus permitting deposition of material on a first number of substrates; and
   a second holder provided in at least one of said one or more openings in said first holder, said second holder comprising a plurality of openings for holding substrates, wherein said second holder permits an increase in throughput during deposition.

17. Method comprising:
   loading one or more substrates into a first substrate carrier, said first substrate carrier having an exterior shaped to be received by an opening in a second substrate carrier; and
   loading said first substrate carrier into a cassette.

18. Method of claim 17 further comprising removing said first substrate carrier from said cassette and loading said first substrate carrier into said opening in said second carrier.

19. Method of claim 17 wherein said first substrate carrier has a substantially circular exterior and said opening in said second substrate carrier accommodates said substantially circular exterior of said first substrate carrier.

20. Method comprising:
providing a cassette, said cassette containing at least one substrate carrier said substrate carrier comprising at least one opening, said opening containing a substrate; and
removing said at least one substrate carrier from said cassette.

21. Method of claim 20 further comprising loading said at least one substrate carrier into an opening within a second substrate carrier after said removing.

22. Method of claim 20 wherein said at least one substrate carrier has an exterior shaped for mating with a second substrate carrier.

23. Method of claim 20 wherein said at least one substrate carrier has a substantially circular exterior.

24. A method comprising:
providing a first substrate carrier having one or more openings, at least one of said one or more of said openings holding a substrate, said first substrate carrier being held by an opening in a second substrate carrier; and
depositing material onto said substrate.

25. Method of claim 24 wherein said depositing comprises sputtering said material onto said substrate.

26. A method comprising:
providing a first substrate carrier having one or more openings, at least one of said one or more of said openings holding a substrate, said first substrate carrier being held by a second substrate carrier, wherein said first substrate carrier has a substantially circular exterior for mating with an opening within said second substrate carrier; and
depositing material onto said substrate.

27. Method comprising:
providing a first substrate carrier having one or more openings, at least one of said one or more of said openings holding a substrate, said first substrate carrier being held by a second substrate carrier; and
unloading said first substrate carrier from said second substrate carrier.

28. Method of claim 27 wherein said first substrate carrier has a substantially circular exterior for mating with an opening in said second substrate carrier.

29. Method of claim 27 further comprising depositing material on said substrate prior to said unloading.

30. Method comprising:
providing a first substrate carrier having one or more openings, at least one of said one or more of said openings holding a substrate, said first substrate carrier being held by an opening in a second substrate carrier; and
unloading said one or more substrates from said first substrate carrier.

31. Method of claim 30 wherein said providing comprises providing at least one substrate in at least one of said one or more openings, said method further comprising depositing material on said at least one substrate prior to said unloading.

32. Method comprising:
providing a first substrate carrier having one or more openings, at least one of said one or more of said openings holding a substrate, said first substrate carrier being held by a second substrate carrier, wherein said first substrate carrier has a substantially circular exterior for mating with an opening in said second substrate carrier; and
unloading said one or more substrates from said first substrate carrier.

33. Method comprising:
providing a first substrate carrier, said first substrate carrier comprising at least a first opening for holding a substrate and at least a second opening for receiving a tool;
providing a tool having a member for being received by and mating with said second opening; and
causing said member to mate with said second opening so that said first substrate carrier is held by said tool.

34. Method of claim 33 wherein said tool removes said first substrate carrier from a cassette.

35. Method of claim 33 wherein said tool places said first substrate carrier into a cassette.

36. Method of claim 33 wherein said tool places said first substrate carrier in a second substrate carrier.

37. Method of claim 36 wherein said first substrate carrier has a substantially circular exterior and said second substrate carrier has an opening for receiving a substantially disk-shaped structure.

38. Method of claim 33 wherein said tool removes said first substrate carrier from a second substrate carrier.

39. Method of claim 38 wherein said first substrate carrier has a substantially circular exterior and said second substrate carrier has an opening for receiving and holding a substantially disk-shaped structure, said opening in said second substrate carrier holding said first substrate carrier, said tool removing said first substrate carrier from said opening in said second substrate carrier.

40. Method comprising loading a first substrate carrier into an opening of a second substrate carrier, said first substrate carrier comprising one or more openings for receiving substrates.

41. Method of claim 40 wherein each of said one or more openings receives and holds a substrate.

42. Method of claim 41 wherein said substrates are disk-shaped, and said opening of said second substrate carrier is shaped to accommodate a disk-shaped substrate.

43. Method of claim 42 further comprising depositing material on said substrate after said loading of said first substrate carrier into said opening of said second substrate carrier.

44. Method of claim 40 wherein said first substrate carrier has a substantially circular exterior for mating with said second substrate carrier.

45. Method comprising loading a first holder into a cassette, said first holder having one or more openings for receiving a substrate, said first holder having an exterior for being received by a second holder.

46. Apparatus comprising:
a first substrate carrier having at least one opening for holding a substrate and an exterior for being held by a second substrate carrier, wherein said first substrate carrier has a substantially circular exterior.

47. A method comprising:
providing a first holder having one or more openings, each opening for holding a substrate, said first holder for permitting deposition of material on a first number of substrates; and
providing a second holder in at least one of said one or more openings in said first holder, said second holder comprising a plurality of openings for holding substrates, wherein said second holder permits an increase in the number of substrates upon which material can be deposited simultaneously.

48. Method of claim 47 wherein said apparatus is a static sputtering apparatus, said apparatus permitting material to be deposited on only one substrate at a time when a substrate is provided in each of said one or more openings of said first carrier, said apparatus permitting material to be deposited on a plurality of substrates at a time when said second carrier is placed within an opening of said first carrier.

49. Method of claim 47 wherein said first holder permits the deposition on a first number of substrates simultaneously when a substrate is provided in each of said openings of said first holder.

50. Deposition apparatus comprising:
   a first holder having one or more openings, each opening for holding a substrate, said apparatus permitting deposition of material on a first number of substrates; and
   a second holder provided in at least one of said one or more openings in said first holder, said second holder comprising a plurality of openings for holding substrates, wherein said second holder permits an increase in the number of substrates upon which material can be deposited simultaneously.

51. Apparatus of claim 50 wherein said apparatus is static sputtering apparatus, said apparatus permitting material to be deposited on one substrate at a time when only one substrate is provided in said one or more openings of said first carrier, said apparatus permitting material to be deposited on a plurality of substrates at a time when said second carrier is placed within said first carrier.

52. Apparatus of claim 50 wherein said apparatus permits the deposition on a first number of substrates simultaneously when a substrate is provided in each of said openings of said first holder.

53. Apparatus comprising:
   a first substrate carrier having at least one opening for holding a substrate and an exterior for being held by an opening in a second substrate carrier.

54. Apparatus of claim 53 further comprising said second substrate carrier, said first substrate carrier being held within said opening within said second substrate carrier.

55. Apparatus of claim 53 wherein said first substrate carrier is held by a cassette.

56. Apparatus of claim 53 wherein said first substrate carrier is within a deposition apparatus.

57. Apparatus comprising:
   a first substrate carrier having at least one opening for holding a substrate and an exterior for being held by a second substrate carrier, wherein said first substrate carrier has a second opening for mating with a tool, said apparatus further comprising a tool comprising a member shaped for mating with said second opening.

* * * * *

UNITED STATES PATENT AND TRADEMARK OFFICE
CERTIFICATE OF CORRECTION

PATENT NO. : 6,528,124 B1
DATED : March 4, 2003
INVENTOR(S) : Nguyen

It is certified that error appears in the above-identified patent and that said Letters Patent is hereby corrected as shown below:

Column 6,
Line 21, "In particular, End piece 302" should be -- In particular, end piece 304 --.

Column 9,
Line 7, "substrate carrier said substrate carrier comprising at" should be -- substrate carrier, said substrate carrier comprising at --.

Column 11,
Lines 9, 10 and 11, "carrier" should be -- holder --.

Column 12,
Line 2, "carrier" should be -- holder --.
Line 4, "carrier is placed within said first carrier" should be -- holder is placed within said first holder --.

Signed and Sealed this

Twenty-sixth Day of July, 2005

JON W. DUDAS
*Director of the United States Patent and Trademark Office*